United States Patent
Charneski et al.

(10) Patent No.: US 6,284,652 B1
(45) Date of Patent: Sep. 4, 2001

(54) ADHESION PROMOTION METHOD FOR ELECTRO-CHEMICAL COPPER METALLIZATION IN IC APPLICATIONS

(75) Inventors: Lawrence J. Charneski; Tuc Nguyen, both of Vancouver, WA (US); Gautam Bhandari, Danbury, CT (US)

(73) Assignees: Advanced Technology Materials, Inc., Danbury, CT (US); Sharp Microelectronics Technology Inc., Camas, WA (US)

( * ) Notice: Subject to any disclaimer, the term of this patent is extended or adjusted under 35 U.S.C. 154(b) by 0 days.

(21) Appl. No.: 09/188,020

(22) Filed: Nov. 6, 1998

Related U.S. Application Data (63) Continuation-in-part of application No. 09/108,260, filed on Jul. 1, 1998.

(51) Int. Cl.[7] ............................................. H01L 21/441
(52) U.S. Cl. .................... 438/653; 438/654; 438/677; 438/687
(58) Field of Search ........................... 438/627, 620, 438/633, 643, 644, 645, 653, 654, 636, 628, 666, 663, 687

(56) References Cited

U.S. PATENT DOCUMENTS

| | | | |
|---|---|---|---|
| 4,842,891 | 6/1989 | Miyazaki et al. | 427/35 |
| 5,096,737 | * 3/1992 | Baum | 427/38 |
| 5,744,192 | 4/1998 | Nguyen et al. | 427/99 |
| 6,001,730 | * 12/1999 | Farkas | 438/627 |
| 6,010,962 | * 1/2000 | Liu | 438/687 |
| 6,015,749 | * 1/2000 | Liu | 438/628 |
| 6,102,993 | * 8/2000 | Bhandari | 106/1.18 |
| 6,171,661 | * 1/2001 | Zheng | 427/535 |

OTHER PUBLICATIONS

Article entitled, Chemical Vapor Deposition of Copper for IC Metallization: Precursor Chemistry and Molecular Structure by P. Doppelt and T. H. Baum, published in MRS Bulletin/Aug. 1994, pp. 41–48.

(List continued on next page.)

Primary Examiner—Stephen D. Meier
Assistant Examiner—David Goodwin
(74) Attorney, Agent, or Firm—Oliver A. Zitzmann; David C. Ripma; Marianne Fuierer (57) ABSTRACT

A method is provided for promoting adhesion of CVD copper to diffusion barrier material in integrated circuit manufacturing. The method includes depositing a first seed layer of copper on the barrier material by chemical vapor deposition (CVD) using (hfac)Cu(1,5-Dimethylcyclooctadiene) precursor. Following the deposition of the seed layer, which strongly adheres and conforms to the copper receiving surfaces on the diffusion barrier, the wafer substrate is positioned in an electro-chemical deposition apparatus, such as an electroplating or electroless plating bath. A second layer of copper is then deposited on the seed layer by means of electrochemical deposition, e.g., electroplating or electroless plating. The second layer of copper deposited by electro-chemical deposition is a "fill" or "bulk" layer, substantially thicker than the seed layer. The method provides good adhesion between the copper and barrier material because the seed layer deposited by (hfac)Cu(1,5-Dimethylcyclooctadiene) strongly adheres and conforms to barrier material and the electroplated or electroless plated copper strongly adheres to the copper seed layer.

26 Claims, 6 Drawing Sheets

OTHER PUBLICATIONS

Article entitled, "Chemical Vapor Deposited Copper from Alkyne Stabilized Copper (I) Hexafluoroacetylacetonate Complexes" by T. H. Baum and C. E. Larson, published in J. Electrochem, Soc. vol. 140, No. 1, Jan. 1993, pp. 154–159.

Article entitled, Kinetics of chemical Vapor Deposition of Copper from (6–diketonate)CuL Precursors by A. Jain, K.M. Chi, T.T. Kodas and M. J. Hampden–Smith, published in Mat. Res. Soc. Symp. Proc. vol. 260, 1992 Materials Research Society, pp. 113–118.

Article entitled, "Electro–Chemical deposition of copper for ULSI Metallization" by V.M. Dubin, C.H. Ting and R. Cheung, presented at VMIC Conference, Jun. 10–12, 1997 –107/97/0069(c), pp. 69–74.

Article entitled, "Adhesioin of Copper Electroplated to Thin Film Tin Oxide for Electrodes in Flat Panel Displays", by S.J. Laverty, H. Feng and P. Maguire, published in J. Electrochem. Soc., vol. 144, No. 6, Jun. 1997, pp. 2165–2170.

Article entitled, Copper Electroplating process for Sub–Half–Micron ULSI Structures by R.J. Contolini, L. Tarte, R.T. Graff, L.B. Evans, present at Jun. 27–29, 1995 VMIC Conference –104/95/0322, pp. 322–326.

Article entitled, "Deposition of Copper Films on Silicon from Cupric Sulfate and Hydrofluoric Acid", by M. K. Lee, J.J. Wang and H.D. Wang, published in J. Electrochem. Soc., vol. 144, No. 5, May 1997, pp. 1777–1780.

* cited by examiner

ADHESION PROMOTION METHOD FOR ELECTRO-CHEMICAL COPPER METALLIZATION IN IC APPLICATIONS

This application is a continuation-in-part of application Ser. No. 09/108,260, filed Jul. 1, 1998, entitled "Adhesion Promotion Method for CVD Copper Metallization in IC Applications," invented by Lawrence Joel Charneski, Tue Nguyen, and Gautam Bhandari.

BACKGROUND AND SUMMARY OF THE INVENTION

The invention relates generally to integrated circuit fabrication processes and manufacturing methods and more particularly to copper metallization techniques used in the formation of conductive interconnections in integrated circuits.

The use of copper for interconnects in integrated circuits is an important field of research for integrated circuit manufacturers. As individual features on integrated circuits (ICs) become smaller, the size of metallized interconnects (lines, vias, etc.) also shrinks. The reduced size of interconnects can create unacceptable resistance in aluminum or tungsten conductors which increases impedance and propagation delays and can limit microprocessor clock speeds. Aluminum also is susceptible to electromigration which, in very fine (i.e., small cross-section) conductors, can cause discontinuities which produce device failure. Copper's greater conductivity, when compared with aluminum, tungsten, or other conductive materials used in ICs, is an important advantage. Copper also has greater resistance to electromigration. Both factors are important to manufacturers of ultra-large-scale-integration (ULSI) IC circuits, which is why copper is the subject of intensive research. The conductivity of copper is approximately twice that of aluminum and over three times that of tungsten. Copper thus is clearly advantageous for use in devices with ever-smaller geometries. With respect to electromigration, copper is approximately ten times better than aluminum, meaning that copper will better maintain electrical integrity.

A principle disadvantage of copper, presenting numerous processing problems for IC manufacturers, is its polluting effect on semiconductor materials. When copper comes in contact with semiconductor material it changes the semiconductor characteristics and destroys active circuit devices. A solution to this problem is to deposit a diffusion barrier material on the IC in regions where contact with copper metal must be avoided. The barrier material blocks the migration of copper into critical semiconductor regions while permitting electrical communication between the copper and the regions of the IC underlying the barrier material. TiN and TaN are examples of well-known and widely used diffusion barrier materials employed in IC copper metallization processes.

But diffusion barriers present another problem associated with copper metallization, copper adheres poorly to diffusion barrier materials. One prior art approach to adhering copper to diffusion barrier materials is to deposit the copper by means of physical vapor deposition (PVD), alternatively referred to as sputtering. PVD involves directing metallic copper onto a target surface. PVD improves adhesion between deposited copper and the barrier material, but copper deposited by PVD exhibits poor conformality with surface features such as steps and high-aspect-ratio vias and trenches.

An alternative copper deposition process is chemical vapor deposition (CVD). In CVD, copper is combined with a ligand, or organic compound (the combination is called a copper precursor), and volatilized. The IC wafer or substrate, coated with diffusion barrier material, is heated and exposed to the precursor which decomposes when it strikes the copper-receiving surface. The heat drives off the organic material and leaves copper behind. Copper applied by conventional prior art CVD processes has greater conformality to surface features than copper deposited by PVD. But for most precursors, CVD adheres poorly to diffusion barrier materials.

Various techniques and been devised to improve the adhesion of CVD copper to barrier material. A typical approach is to apply CVD copper immediately after the deposition of the diffusion barrier material. It has generally been thought that the copper layer has the best chance of adhering to the diffusion barrier material when the diffusion barrier material surface is clean. Hence, the diffusion barrier surface is often kept in a vacuum, or controlled environment, and the copper is deposited on the diffusion barrier as quickly as possible. However, even when copper is immediately applied to the diffusion barrier surface, problems remain in keeping the copper properly adhered. A complete understanding of why copper does not always adhere directly to a diffusion barrier surface is lacking.

Despite the large amount of effort that has been expended on CVD, two major obstacles remain before a CVD copper process can be adopted in manufacturing. These two critical hurdles are (i) high cost of ownership (COO) for the CVD process and (ii) reliable adhesion to barriers. The presently available MOCVD processes and precursors do not satisfactorily fulfill both these criteria simultaneously without compromising film and process attributes. Since the precursor cost is a major contributor (>65%) to the overall COO of the CVD process, precursors that can be inexpensively manufactured are preferred. However, precursor costs have to be lowered without compromising film properties. For instance, reliable and repeatable adhesion has to be achieved while simultaneously maintaining low via and contact resistance, high deposition rate, high conformality, as well as low cost of the precursor. Many IC manufacturers have employed a PVD Cu seed layer followed by a CVD Cu fill in order to achieve adequate film properties. The use of a PVD Cu seed layer underscores the difficulty in achieving low contact resistance and reliable adhesion on barriers (TiN or TaN) by a CVD process alone.

As the size of features on ICs continues to shrink, it is desirable to continue developing improvements in the adhesion of CVD copper to barrier materials as a replacement for PVD, which is unsuitable for metallizing the smallest features.

The poor adhesion between copper and diffusion barrier materials has limited the use of electrochemical deposition techniques, such as electroplating and electroless plating, for depositing copper on ICs. Electro-chemical deposition, in which copper is chemically deposited on exposed surfaces through electro-chemical reactions, galvanic deposition, or electroplating, is a cost-effective process for depositing relatively thick (e.g., 1-micron or greater) layers of bulk copper on surfaces. But because copper can be effectively deposited electro-chemically only on copper surfaces, the process requires an initial "seed" layer of copper on the target surface for effective adhesion. In other words, electrochemical deposition is a 2-step process. A seed layer of copper is first deposited on the diffusion barrier material and the electro-chemically deposited copper is then applied to any desired thickness. To ensure good adhesion to the diffusion barrier material, prior art electro-chemically copper deposition methods generally employ PVD (sputtered) copper as the seed layer. But the PVD seed layer will have the usual problem of poor conformality in high-aspect-ratio features. Since electro-chemically deposited copper will only adhere to copper previously deposited, uniformity requires that all features receive at least some coating of the seed layer. Discontinuities and poor conformance is a particular problem at the bottom of vias and trenches and other high-aspect-ratio features. Thus, electro-chemical deposition becomes increasingly difficult to use as the size of individual features decreases, as long as the seed layer of copper is applied by PVD.

It would be advantageous to provide a method of improving the adherence of copper metallization to diffusion barrier material without the sacrifice in conformality associated with PVD copper.

It would also be advantageous to provide a method of depositing copper on diffusion barrier material using chemical vapor deposition (CVD) to improve conformality, while also improving the adhesion between the copper and the barrier material.

In addition, it would be advantageous to discover a method of adhering a thin seed layer of copper to the surface of diffusion barrier material using high conformality CVD, wherein the thin seed layer serves as a receiving surface for the deposition of additional copper by a technique which is cost effective, such as electro-chemical deposition, wherein the additional copper adheres strongly to the seed layer of copper through copper-to-copper bonds.

Accordingly, a method is provided for use in integrated circuit manufacturing for applying copper to selected copper-receiving surfaces of an integrated circuit substrate. The method comprises steps which include positioning the integrated circuit substrate in a chemical vapor deposition (CVD) chamber. In the CVD chamber, a first adhering conforming layer of copper is deposited on the copper receiving surfaces by means of chemical vapor deposition using (hfac)Cu(1,5-Dimethylcyclooctadiene) precursor. The first layer of copper conforms and adheres to the copper-receiving surface and provides a copper seed layer to which subsequently-deposited copper will adhere. And then a second layer of copper is deposited on the first layer of copper by means of electro-chemical deposition. The substrate is positioned in an electro-chemical deposition apparatus and additional copper is deposited on the first adhering conforming layer of copper. The second layer of copper is deposited by means of electro-chemical deposition until a predetermined thickness of copper is formed on each copper-receiving surface.

A suitable final thickness for the first adhering conforming layer of copper deposited in the CVD step is a maximum of 1000 angstroms, with a suggested thickness range being generally in the range of 50 to 480 angstroms and a preferred thickness generally in the range of 100 angstroms to 200 angstroms.

In a first alternative embodiment of the present invention, the second layer of copper, deposited during the electro-chemical deposition of copper step, is preferably deposited on the first layer by means of electroplating. That is, copper is deposited onto the first adhering conforming layer in an electrolytic bath by galvanic action.

A second alternative embodiment of the present invention is to deposit the second layer onto the first layer by means of electroless plating. In electroless plating the substrate, with the first adhering conforming layer deposited thereon, is immersed in an electroless copper plating bath containing a cupric salt and a reducing agent. Additional copper is deposited on the first layer, forming the second layer.

In both the first and second alternative embodiments of the present invention, the deposition of the second layer of copper by electro-chemical deposition is carried out until the second layer reaches any desired thickness, preferably filling any voids, vias, and channels into which copper conductors are to be formed.

The copper-receiving surfaces of an integrated circuit on which copper is deposited in accordance with the present invention will generally be diffusion barrier material applied to the integrated circuit substrate. Accordingly, another alternative embodiment of the present invention preferably includes the preliminary step of depositing diffusion barrier material on the integrated circuit to form the copper-receiving surfaces on which the above-described method is practiced. The step of depositing diffusion barrier material includes depositing material selected from the group consisting of TiN, TiON, TiSiN, Ta, TaSiN, TaN, TiW, TiWN, Mo, WN, and WSIN.

DETAILED DESCRIPTION OF THE PREFERRED EMBODIMENT

Figure 1:
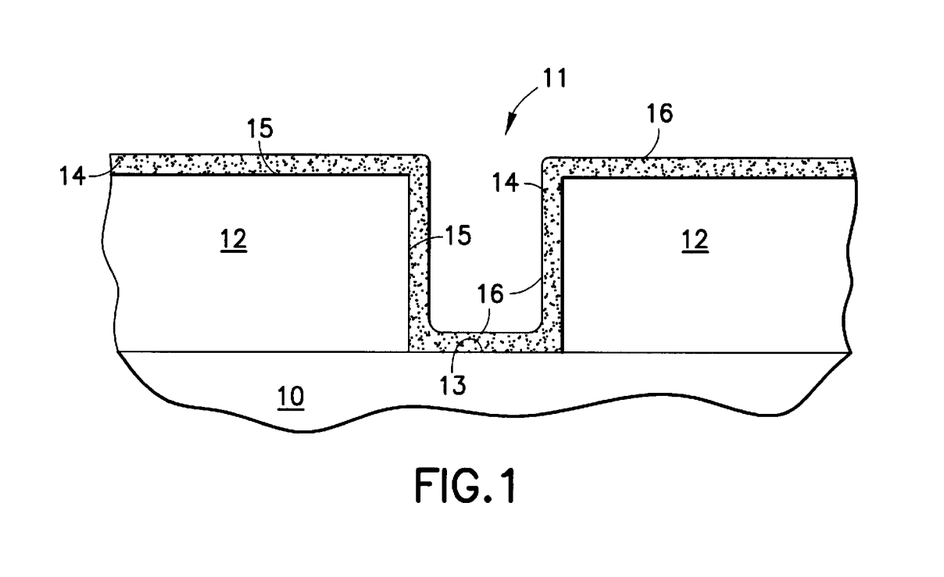
FIGS. 1 and 2 schematically show a sectional view of a portion of an integrated circuit substrate or wafer and illustrate steps in the method of the present invention.

FIG. 1 is a schematic depiction of a small portion of a silicon or other suitable material semiconductor wafer 10 on which a plurality of integrated circuits are formed. In cross section, a single feature in the form of a trench or via 11 is formed in dielectric material 12 deposited on the surface 13 of the wafer 10. Via 11 illustrates the type of high-aspect-ratio feature which presents a challenge to deposit into during integrated circuit (IC) manufacturing. That is particularly true when copper is being deposited in the via 11 since it is first necessary to coat the interior walls and all other exposed surfaces with a continuous expanse of diffusion barrier material to prevent direct copper contact with the wafer substrate 10 and other features. High aspect ratio features are also a challenge when depositing a first or "seed" layer of copper on the diffusion barrier, as described below, since a continuous copper layer is most desirable.

FIG. 1 illustrates a deposited layer of diffusion barrier material 14 on all surfaces 15 of the dielectric layer 12, including the walls of via 11, and on a portion of the surface 13 of substrate 10, within via 11. Other features (not shown) on substrate 10 will receive a similar surface deposit of diffusion barrier material and it will be understood by those skilled in the art of IC manufacturing that numerous features, and layers of features, may be present on substrate 10. The present invention is suitable for adherent CVD copper deposition on diffusion barrier material deposited on IC substrates during semiconductor device manufacturing and the figures presented herein illustrate the process and do not limit its application to any particular features or architecture.

The diffusion barrier material layer 14 (alternatively referred to as barrier layer 14) is deposited on the substrate (the exposed or top surfaces 13 and 15 in FIG. 1 of the IC being manufactured) by any suitable conventional means. The preferred method of forming barrier layer 14 is chemical vapor deposition (CVD), as will be described below, although other barrier material deposition processes may be used within the scope of the present invention, for example, physical vapor deposition (PVD) (i.e., sputtering). The thickness of diffusion barrier layer 14 is generally in the range of 25 Å to 800 Å, although the final selection of thickness is a matter of design choice and optimization. If it is deposited by CVD, the barrier layer 14 can be thinner since full coverage of features is substantially better. If deposited by PVD, the barrier layer 14 must be thicker to ensure continuous coverage within features such as via 11.

Barrier layer 14 prevents the migration of copper into the underlying layer or layers of material which may be present on an IC substrate, or into the semiconductor substrate 10 itself. Two well-known diffusion barrier materials suitable for use with the present invention are titanium nitride TiN) and tantalum nitride TaN). The diffusion barrier material layer 14 is deposited in any selected region of the substrate where copper is to be deposited. In the illustrative embodiments of the present invention, and in many typical copper metallization processes used today, substantially all the surfaces of the wafer 10, including substantially all structures formed thereon, will receive a deposit of diffusion barrier material. All surfaces 16 of diffusion barrier layer 14, both within and outside via 11, are herein referred to as the copper-receiving surfaces of the integrated circuit substrate onto which adherent CVD copper is deposited in a CVD step of the present invention. Alternatively, the surfaces 16 of diffusion barrier layer 14 are referred to as copper-receiving surfaces on the integrated circuit substrate or copper-receiving surfaces on the diffusion barrier material deposited on the IC substrate.

Diffusion barrier materials are preferably electrically conductive to permit electrical communication between the copper layer deposited, as described below, on copper-receiving surfaces 16, and the regions of IC substrate 10 to which an electrical connection is desired. In addition to TiN and TaN mentioned above, other suitable diffusion barrier materials may be used with the method of the present invention. In its preferred embodiment, the diffusion barrier material is selected from the group consisting of TiN, TiON, TiSiN, Ta, TaSiN, TaN, TiW, TiWN, Mo, WN, and WSiN.

The selection of the diffusion barrier material for layer 14 is usually a matter of optimization. It depends on the processing steps which will be used before, during and after copper metallization. For example, TaN is generally recognized to be the most effective in preventing the diffusion of copper, although TiN is similar and provides better results if copper metallization is followed by chemical-mechanical polishing (CMP) to remove copper from selected regions of the IC substrate. For the purposes of discussing the present invention, it will be assumed herein that diffusion barrier layer 14 is TiN or TaN, although use of the alternative diffusion barrier materials is within the scope of the present invention.

Figure 2:
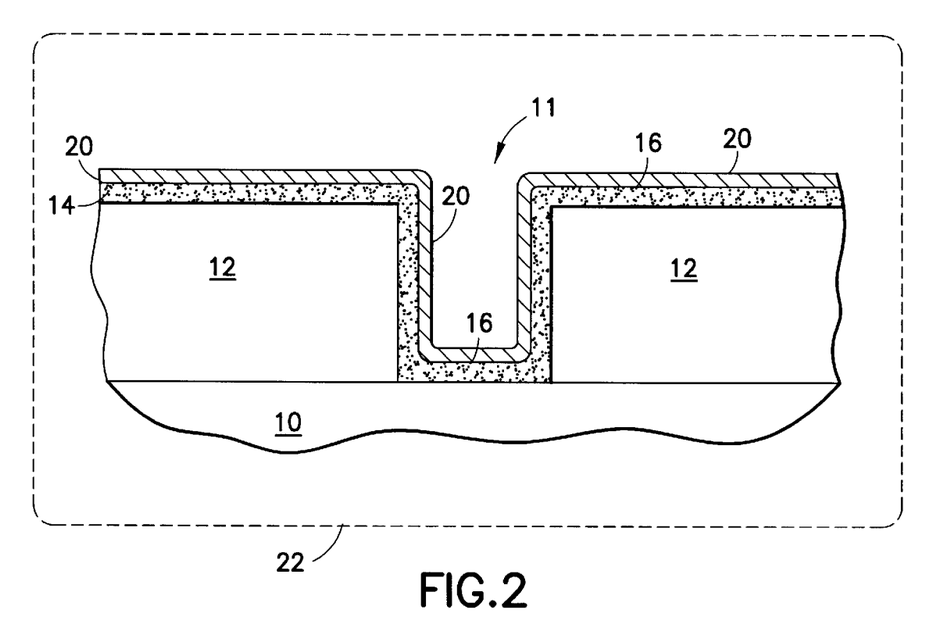
Figure 6:
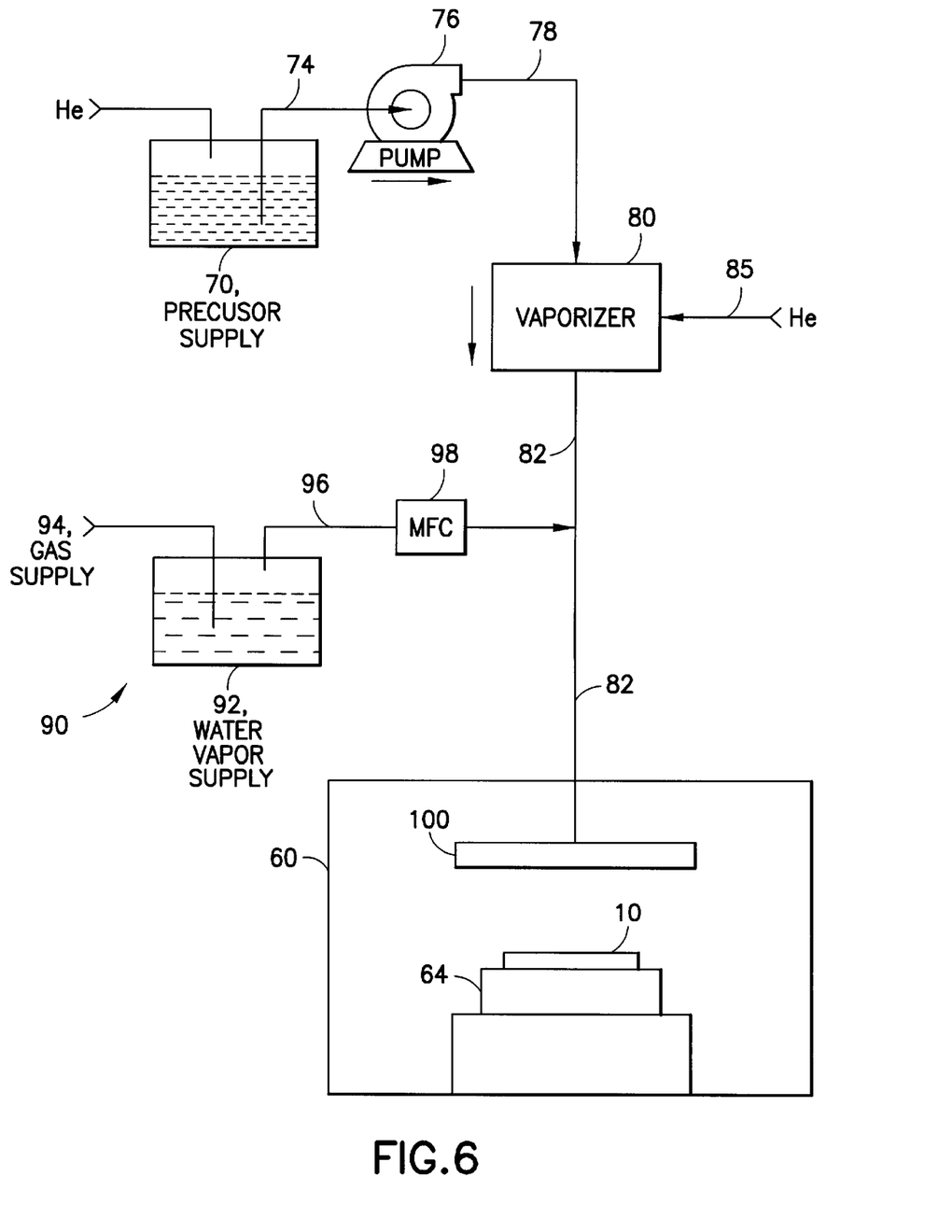
FIG. 6 is a partial schematic representation of a CVD chamber and associated apparatus for carrying outs certain steps in the method.

The first step in the present invention is to position the substrate 10, as shown in FIG. 1 with barrier layer 14 thereon, in a chemical vapor deposition (CVD) chamber. CVD chamber 22 is schematically depicted in FIG. 2 by dashed lines. CVD chamber 22, which is more fully described with reference to FIG. 6, is a controlled-atmosphere reaction chamber into which a semiconductor wafer, such as integrated circuit substrate 10, is placed. Essentially, chemical vapor deposition involves introducing a metal CVD precursor, in the form of a metalorganic vapor, into a sealed chamber at an ambient pressure of 0.5 Torr-5 Torr (the preferred range is usually 2.0-Torr or less). A copper-containing precursor is introduced into the chamber. The integrated circuit substrate is heated to a temperature sufficient to cause thermal decomposition of the precursor. When the precursor strikes the copper-receiving surface of the substrate (barrier layer 14) the heated surface volatilizes the organic reactants and deposits high-purity metal on the substrate.

CVD processes are well known to those skilled in the art and have been the subject of extensive research related to copper metallization. See, for example, U.S. Pat. No. 4,842,891 entitled "Method of Forming a Copper Film by Chemical Vapor Deposition"; U.S. Pat. No. 5,744,192 entitled "Method of Using Water Vapor to Increase the Conductivity of Copper Deposited with Cu(hfac)TMVS"; T. H. Baum et al., "Chemical Vapor Deposition of Copper from Alkyne Stabilized Copper (I) Hexafluoroacetylacetonate Complexes," *Journal of the Electrochemical Society*, Vol. 140, No. 1, January 1993, pp. 154–159; and P. Doppelt et al., "Chemical Vapor Deposition of Copper for IC Metallization: Precursor Chemistry and Molecular Structure," *Materials Research Society Bulletin*, August 1994, pp. 41–48. Numerous precursors have been developed for use in copper CVD. All possess similar qualities in that most are relatively stable at room temperatures yet decompose into the deposited copper and reaction byproducts to leave high-purity copper on the receiving surfaces of the substrate at a consistent temperature, usually between 170° C. and 220° C. Many copper precursors have been developed and investigated. For example, several are identified and discussed in P. Doppelt et al., id., and a partial list of additional precursors is found in T. H. Baum et al., supra.

Referring to FIG. 2, after positioning integrated circuit substrate 10 in CVD chamber 22, the next step in the method of the present invention is to deposit a first adhering conforming layer of copper, by means of CVD, on each copper-receiving surface 16 of the substrate. The first adhering conforming layer of copper 20 is a thin layer of copper, not more than 1000 Å thick. It is recommended that first copper layer 20 have a thickness generally in the range of 50 Å to 480 Å and the preferred thickness is generally in the range of 100 Å to 200 Å.

The present invention employs the copper-containing precursor (hfac)Cu(1,5-Dimethylcyclooctadiene) in the step of depositing a first layer, or "seed" layer, of copper 20 by CVD on the copper-receiving surfaces 16 of the IC substrate. Experimentation has revealed that (hfac)Cu(1,5-Dimethylcyclooctadiene) deposits an adhering conforming layer of copper isotropically on the copper receiving surfaces 16. The precursor (hfac)Cu(1,5-Dimethylcyclooctadiene) is available from Advanced Delivery and Chemical Systems, Ltd., of Danbury, Conn. under its trademark "CU15." Alternative chemical identifiers for (hfac)Cu(1,5-Dimethylcyclooctadiene) include 1,1,1,5,5,5-Hexafluro-2,4-pentanedionato copper(1,5-dimethyl 1,5-cyclooctadiene); or (hfac)Cu(DMCOD); (hfac)Cu(Dimethyl COD); or (hfac)Cu(1,5-Dimethyl COD); or (hfac)Cu(1,5-DMCOD). This precursor has been found to produce excellent adherence to the surface of TiN and TaN diffusion barrier materials and exhibits excellent conformality and good resistivity, but it has not been widely used heretofore because of its low copper deposition rate which makes it uneconomic for bulk deposit of copper. Precursor (hfac)Cu(1,5-Dimethylcyclooctadiene) was the subject of early investigation, see P. Doppelt, id., but its low deposition rate renders it too costly for production applications using conventional methodologies. When used with the two-step copper metallization process of the present invention, however, the inventors of the present invention have determined that (hfac)Cu(1,5-Dimethylcyclooctadiene) is an ideal precursor for carrying out the step of depositing a first adhering conforming layer 20 of copper on the substrate 10. It is therefore the precursor used in carrying out the step of depositing a first adhering conforming layer of copper by means of CVD on each copper-receiving surface of the substrate.

Figure 3:
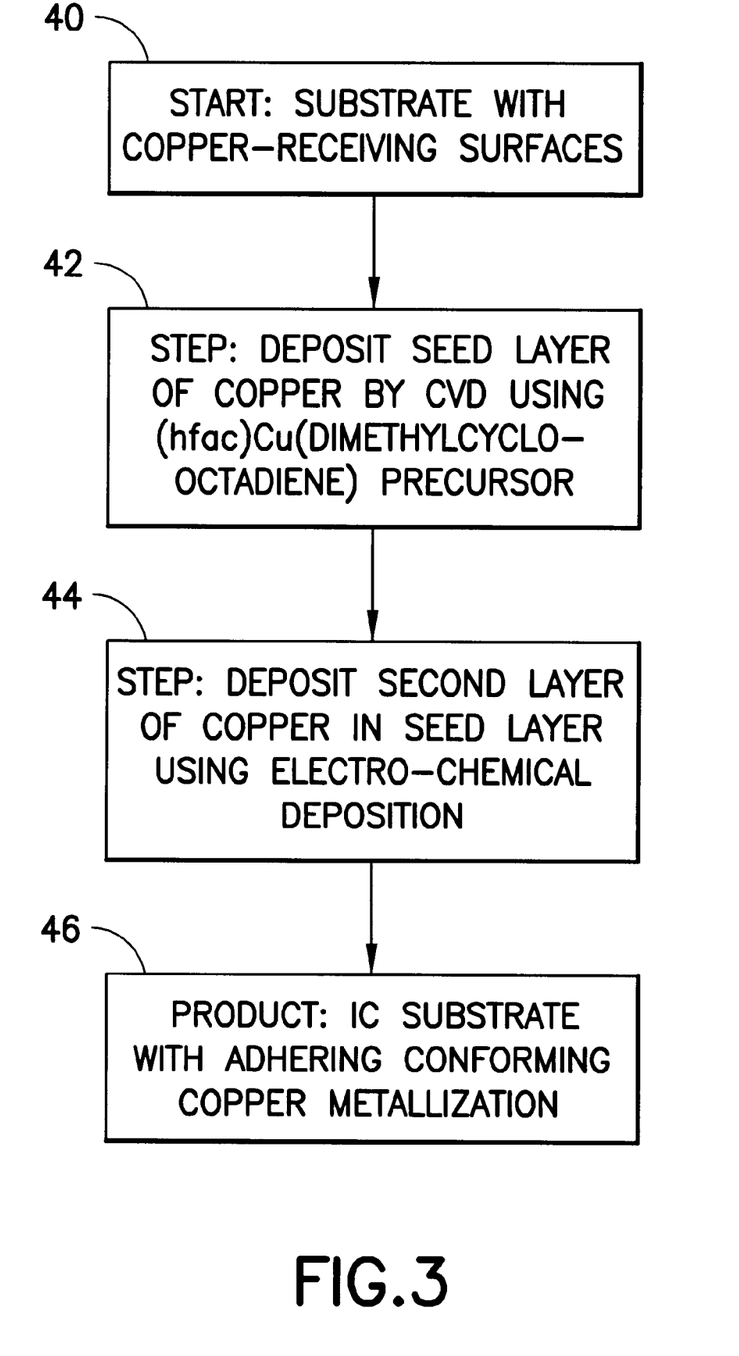
FIG. 3 is a flow chart showing the steps in the adhesion promotion method of electro-chemical copper metallization in accordance with the present invention.
Figure 4:
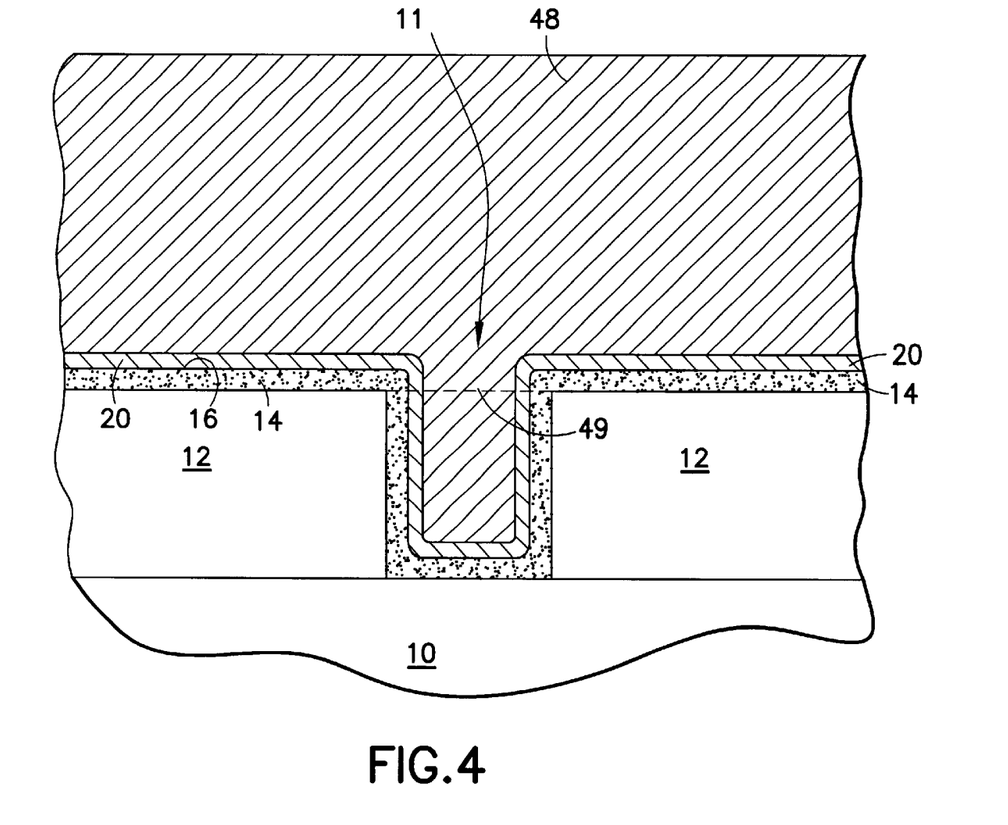
FIG. 4 shows a sectional view as in FIGS. 1 and 2 illustrating a further step in the method of the present invention.

The steps in the method of the present invention are illustrated in FIG. 3, yielding the structure shown in FIG. 4. Referring to FIG. 3, the method starts at 40 with a substrate such as an IC wafer or the like. Selected surfaces of the wafer, including features deposited or formed on the wafer substrate, have been covered with diffusion barrier material such as layer 14 in FIG. 1. The copper-receiving surfaces of the substrate are surfaces 16 (FIG. 1) of barrier layer 14 onto which copper is subsequently deposited. Typically, in CVD copper processing, substantially the entire surface of a semiconductor wafer is coated with diffusion barrier material.

Next, in step 42, a first or seed layer 20 (FIG. 2) of copper is deposited on surfaces 16 (FIG. 1) by means of CVD. The copper precursor for carrying out CVD deposition in step 42 is (hfac)Cu(1,5-Dimethylcyclooctadiene). The CVO copper deposited in step 42 is preferably a thin layer, less than 1000 Å thick, and recommended to be between 50 Å to 480 Å thick and more preferably between 100 Å and 200 Å thick. Layer 20 is alternatively referred to herein as first adhering conforming layer 20.

The method then proceeds to step 44, which is to deposit a second layer of copper on first adhering conforming layer 20 by means of electro-chemical deposition. Step 44 is carried out in order to provide a predetermined overall thickness of copper on the copper receiving surfaces of the substrate. The second layer of copper deposited in step 44 is characterized as the "fill" layer and can alternatively be called the "gap fill" layer because it is intended to be a thick layer of copper, up to 1-micron or more in thickness. The second copper layer is intended to fill trenches and vias in the topography of the copper-receiving surfaces. Step 44 is the step where most of the mass of copper deposited on an integrated circuit substrate is laid down using electro-chemical deposition methods such as electroplating or electroless plating, which have a higher copper deposition rate and are thus less expensive to use than CVD.

Product 46 is the result of the method of the present invention. The product is an IC substrate on which layers of copper and barrier material have been deposited. Usually, the substrate will then be subjected to numerous additional processing steps to finish the individual integrated circuit chips on a wafer.

FIG. 4 shows the result of carrying out the two-step copper deposition method of the present invention on substrate 10. Following the deposit of first adhering conforming layer 20, a second layer of copper 48 is deposited (in step 44 of FIG. 3) onto the first layer until a predetermined thickness of copper has been laid down on each copper-receiving surface 16 of the substrate. The deposit of the second copper layer 48 is by electro-chemical deposition using an electro-chemical deposition apparatus. Electro-chemical deposition is carried out either by electroplating or electroless plating in a bath or liquid-filled chamber or cell which contains an aqueous solution of copper, usually together with other ingredients which enhance or control the copper deposits onto the first layer of copper 20.

In a first alternative embodiment of the present invention the step 44 (FIG. 3) of depositing second layer of copper 48 (FIG. 4) onto the first layer 20 is carried out by electroplating. The electroplated second layer of copper is a thick or bulk layer which fills via 11 and covers other features. Electroplating is suitable for depositing second layer 48 because it is an economical and well-known process, it provides uniform coverage, good adherence to copper surfaces such as first layer 20, and provides acceptable deposition rates. Electroplating systems and methods are well known to those skilled in the art of integrated circuit interconnect technology. Typically, the substrate is inverted over or immersed in an electro-chemical cell or bath. The reservoir of the cell contains a copper-containing electrolytic solution, such as Sel-Rex Copper Electroplating Solution, made by Enthone-OMI, Inc., or another suitable commercially available copper plating solution. Other ingredients may be present to control the nature of the copper deposit. The copper containing electrolyte typically contains copper sulfate ($CuSO_4$) and sulfuric acid ($H_2SO_4$) plus additives. An electrical potential is established between the seed copper layer on the substrate, layer 20, which forms the cathode, and an anode immersed in the electrolytic bath. A pulsed or continuous plating current is employed to release copper ions from the electrolyte and deposit metallic copper on the cathode seed layer 20. Typical plating currents of 20–200 $\mu a/cm^2$ (microamperes per square centimeter) are employed in electroplating. If pulsed currents are used, suitable pulse durations range from 1–20 milliseconds on, and 5–60 milliseconds off.

Figure 5:
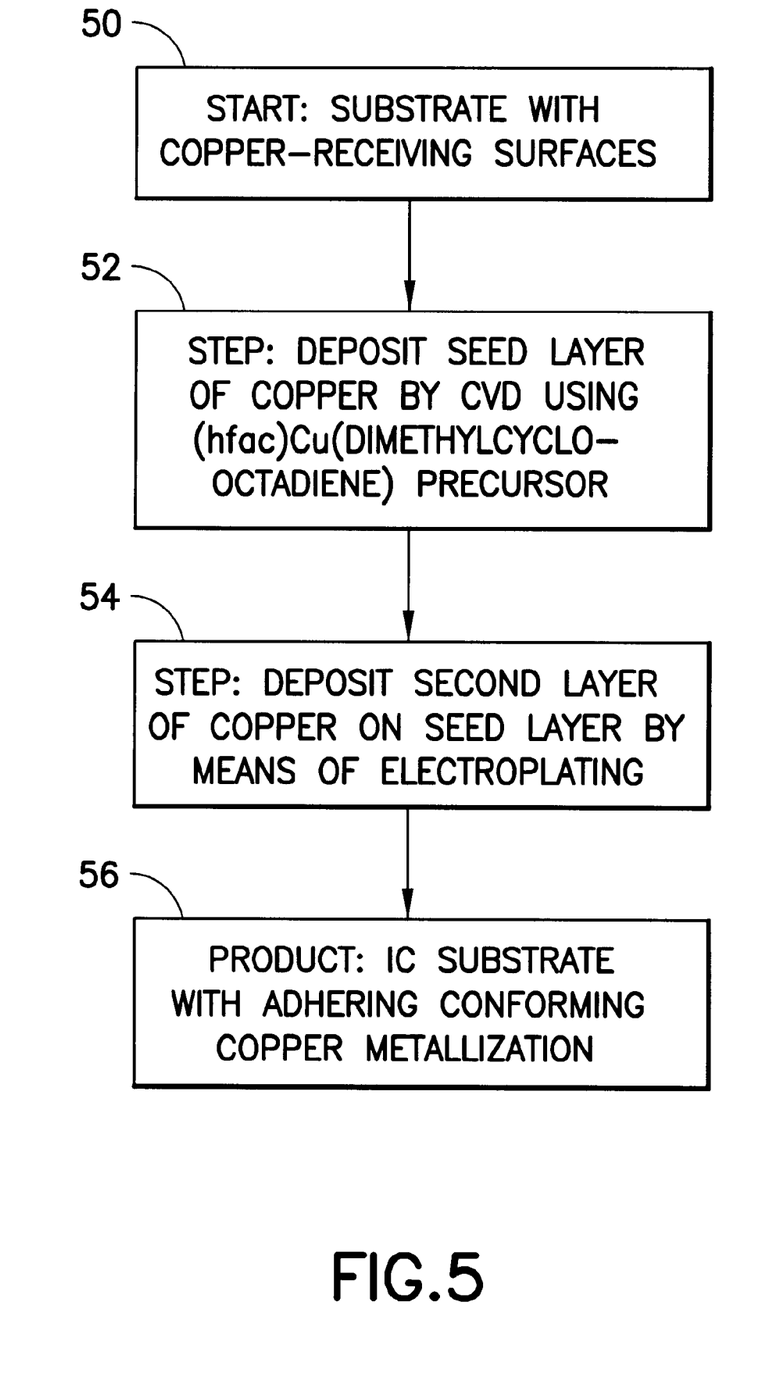
FIG. 5 is a flow chart showing the steps in a first embodiment of the adhesion promotion method of the present invention.

The steps in the first alternative embodiment of the method of the present invention, in which the second copper layer 48 is deposited by electroplating, are illustrated in FIG. 5. Referring to FIG. 5, the starting substrate 50 and first copper deposition step 52 by means of CVD are the same as the starting point 40 and first deposition step 42 in FIG. 3. The result of step 52 is the structure shown in FIG. 2. Next, in step 54, a second layer of copper is deposited on first adhering conforming layer 20 by means of electroplating, as described above. The product 56 is the structure shown in FIG. 4 which, as with the embodiment described with reference to FIG. 3, will typically be subjected to numerous additional processing steps to finish the individual integrated circuit chips on a wafer.

Electroplating second copper layer 48 allows the bulk of the copper deposited on the substrate to be deposited by a methodology which yields substantially higher deposition rates, at lower cost, than the method used to deposit first layer 20. And the method avoids the problem of poor adhesion between electroplated copper and barrier materials. Instead, the method takes advantage of the good adhesion and conformality exhibited between the barrier material of layer 14 and first copper layer 20, which is deposited by CVD using (hfac)Cu(1,5-Dimethylcyclooctadiene) precursor. The subsequently-deposited electroplated copper of second layer 48 adheres strongly to copper through copperto-copper bonds, and electroplated second layer 48 is deposited only on first copper layer 20. As a result, the present method yields deposited copper on the IC substrate which both strongly adheres and conforms to the surface features of the substrate and to barrier layer 14.

FIG. 6 is a schematic drawing of a suitable chemical vapor deposition (CVD) apparatus for carrying out the CVD step in the method of the present invention. CVD chamber 60 is a sealed reaction chamber. Wafer/IC substrate 10 is positioned on a heated chuck 64. As shown in FIG. 6, wafer 10 has either been processed to include a diffusion barrier layer 14 on its surface, as shown and described above with reference to FIG. 1, or has not yet had layer 14 deposited, if the diffusion barrier is deposited using CVD. For the purposes of the following description, it is assumed that the apparatus will be used to deposit first adhering conforming copper layer 20 (see FIGS. 1–3). Thus, the wafer 10, which is positioned in CVD chamber 60 on a supporting chuck 64 is the starting substrate (40 in FIG. 3; 50 in FIG. 5; and 120 in FIG. 7).

The interior ambient pressure in CVD chamber 60 is preferably generally in the range of 0.5-Torr to 2.0-Torr, although a broader range of pressures have been successfully used when depositing CVD copper. Further experimentation may show that CVD chamber pressures generally in the range of 0.1-Torr to 5.0-Torr may be useable with the present invention although the first-named range is preferred.

The liquid precursor used in the CVD of copper step (42 in FIG. 3) is (hfac)Cu(1,5-Dimethylcyclooctadiene), which is supplied to CAID chamber 60 from a precursor supply reservoir 70, schematically shown as an enclosed tank. An inert gas such as helium (He) is used to displace the liquid precursor from supply reservoir 70. The precursor passes through a line 74, through a suitable pump 76 or other similar flow control device, and via line 78 into vaporizer 80. The precursor is heated and vaporized and travels via line 82 to CVD chamber 60. Additional inert gas (He) is added to the vaporized precursor at 85.

Water vapor is preferably added to the vaporized precursor as it enters chamber 60 from a water vapor supply 90. The use of water vapor to improve the characteristics of CVD copper is described in detail in U.S. Pat. No. 5,744,192, invented by Nguyen et al., the specification of which is incorporated herein by reference. As shown in FIG. 6, the water vapor supply 90 includes a bubbler tank 92 in which an inert gas, such as helium (He) or Argon (Ar), is supplied from gas supply 94 through the water in bubbler 92. Gas saturated with water is carried via line 96 to a mass flow controller (MFC) 98. The water saturated gas joins vaporized precursor line 82 before it enters CVD chamber 60. The vaporized precursor mixed with water vapor is distributed in chamber 60 through a suitable shower head 100. Other systems for adding water to copper precursors may alternatively be used with the method of the present invention.

The chuck 64 which supports wafer 10 in chamber 60 is heated to produce a temperature generally in the range of 170° C. to 250° C. at copper receiving surface 16 of diffusion barrier layer 14 on wafer 10 (see FIG. 1). As is well known to those skilled in the art of CVD copper, the vaporized precursor volatilizes when it strikes heated surface 16, depositing a layer of high purity copper metal on exposed surfaces. The deposition rate for the copper is dependent on the type of precursor used, the precursor flow rate, chamber temperature and pressure, and other factors. The present invention uses (hfac)Cu(1,5-Dimethylcyclooctadiene) precursor in the step of depositing a seed layer of copper on the barrier layer by CVD. The flow rate of the liquid precursor (hfac)Cu(1,5-Dimethylcyclooctadiene) from precursor supply 70 into vaporizer 80 is generally in the range of 0.05 cc/min to 2.5 cc/min. That flow rate generally yields a deposition rate of copper on surface 16 in chamber 60 of 200–400 Å per minute.

Figure 7:
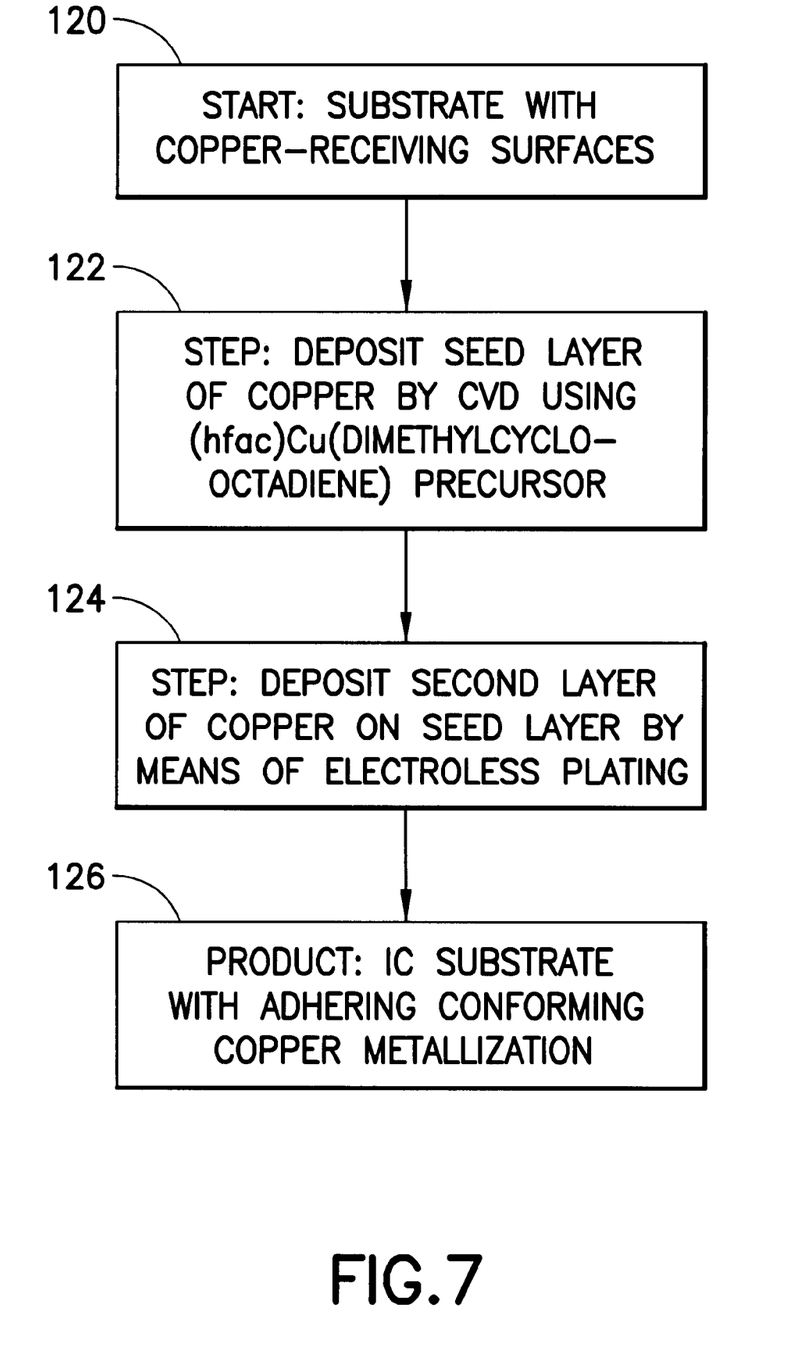
FIG. 7 is a flow chart illustrating steps in another embodiment of the method of the present invention.

FIG. 7 illustrates a second alternative embodiment of the method of the present invention in which the electrochemical deposition of the second copper layer 48 (FIG. 4) is performed by electroless plating of copper onto seed layer 20. The starting substrate 120 and first copper deposition step 122 by means of CVD are the same as the starting point 40 and deposition step 42 in FIG. 3. The result of step 122 is the structure shown in FIG. 2. Next, in step 124, a second layer of copper is deposited on first adhering conforming layer 20 by means of electroless plating, as described below. The product 126 is the structure shown in FIG. 4 which, as with the embodiment described with reference to FIG. 3, will typically be subjected to numerous additional processing steps to finish the individual integrated circuit chips on a wafer.

Electroless plating is a suitable alternative process for depositing second layer 48. In electroless plating the substrate, with a seed layer of copper deposited on suitable barrier material in the regions where bulk copper is desired to be deposited, is placed in an electroless plating bath. Typical electroless plating baths contain a solution of copper sulfate ($CuSO_4$) with formaldehyde as the reducing agent. Certain amines and complexing agents are also present and the baths are adjusted to have a pH of around 11 by the addition of sodium hydroxide. As is well known to those skilled in the art, electroless copper deposition occurs when the seed layer of copper catalyzes oxidation of the reducing agents, transporting electrons from anodic sites of oxidation to cathodic sites where copper ions are reduced. Once started the electroless deposition of copper becomes autocatalytic. Unlike electroplating, the seed layer of copper on the substrate required for electroless plating need not be continuous since the seed layer is not employed to complete an electrical circuit.

What follows are examples of the method of the present invention in which an IC wafer is processed in accordance with the method of the present invention. Where appropriate, references to devices in FIG. 6 will be identified. The wafer processed in this example is positioned in a CVD chamber 60, having been previously coated with 400 Å of TiN.

EXAMPLE 1

A wafer 10, positioned on chuck 64 in chamber 60, is heated to a temperature of 195° C. CVD chamber 60 is kept at 0.5-Torr (interior) chamber pressure. The precursor (hfac)Cu(1,5-Dimethylcyclooctadiene) from supply 70 is injected into vaporizer 80 at a flow rate of 0.2 g/min. The flow of water bubbled inert gas (Ar) is turned on at a flow of 10 sccm. The vaporizer 60 is maintained at 60° C. The flow rate of the inert carrier gas (He) 85 is maintained at 100 sccm. After 60 seconds of precursor flow approximately 480 Å of an adhering, conformal seed layer has been deposited on the copper receiving surfaces of the wafer. At this stage, the wafer is removed from chamber 60 and positioned over an electroplating cell with the deposited seed layer of copper in contact with an electrolytic bath containing 1.0 M copper sulfate and 1.0 M sulfuric acid. An electric potential is operatively connected between the copper seed layer on the substrate and a submerged anode in the cell. A pulse plating current of 150 ma/cm$^2$ is employed with an on duration of 5 milliseconds and off duration of 10 milliseconds for approximately ten minutes until an overall thickness of 1 micron of deposited copper has been laid down. The resulting wafer has a shiny, metallic copper film deposited on it that shows excellent adhesion and can be successfully etched via CMP.

EXAMPLE 2

A wafer 10, positioned on chuck 64 in chamber 60, is heated to a temperature of 195° C. CVD chamber 60 is kept at 0.5-Torr (interior) chamber pressure. The precursor (hfac)Cu(1,5-Dimethylcyclooctadiene) from supply 70 is injected into vaporizer 80 at a flow rate of 0.2 g/min. The flow of water bubbled inert gas (Ar) is turned on at a flow of 10 sccm. The vaporizer 60 is maintained at 60° C. The flow rate of the inert carrier gas (He) 85 is maintained at 100 sccm. After 60 seconds of precursor flow approximately 480 Å of an adhering, conformal seed layer has been deposited on the copper receiving surfaces of the wafer. At this stage, the wafer is removed from chamber 60 and positioned in an electroless plating bath containing 1.0 M copper sulfate and 1.0 M formaldehyde, plus ethylenediaminetetraacetic acid (EDTA), tetramethylammonium hydroxide, and surfactant. The bath is maintained at 75° C., producing a deposition rate of approximately 1000 angstroms/min.

The present invention overcomes several problems associated with copper deposition which have heretofore been the subject of intense study. Most particularly, the present invention solves the problem of reliable adhesion of electrochemically deposited copper to diffusion barrier materials. Using a two-step process, the invention deposits a first copper layer by CVD using (hfac)Cu(1,5-Dimethylcyclooctadiene) precursor, the resultant layer being adherent and conforming to barrier materials. The precursor used, (hfac)Cu(1,5-Dimethylcyclooctadiene), is selected for depositing the first CVD copper layer because it is reliably and repeatably adherent to diffusion barriers. Because only a thin layer is deposited, the cost of the first precursor used in depositing the first copper layer, or its poor deposition rate, is relatively unimportant. Nevertheless, the discovery that (hfac)Cu(1,5-Dimethylcyclooctadiene) can be used to form a "seed" layer of CVD copper on diffusion barrier material represents an important advance in the art. The thin "seed" layer of deposited copper serves as an excellent foundation for the subsequent deposition of larger quantities of copper using more conventional, higher yield, higher deposition rate processes, namely, electroplating or electroless plating. Those precursors will readily adhere to the "seed" layer because of strong copper-to-copper bonding. The two-step copper deposition method of the present invention ensures the lowest cost-ofownership possible for copper metallization because the first layer deposited by a technique which is optimized for adhesion and contact resistance, regardless of cost, deposition rate, or other characteristics, and the second deposition technique is selected to optimize bulk fill at low cost.

What is claimed is:

1. In integrated circuit fabrication, a method of applying copper to a barrier material substrate, the method comprising the following steps:

a) providing a diffusion barrier material substrate having deposited thereon a diffusion barrier material;

b) in a chemical vapor deposition (CVD) chamber, depositing a first adhering conforming layer of copper by means of CVD on the diffusion barrier material substrate using (hfac)Cu(1,5-Dimethylcyclooctadiene) precursor, whereby said first layer of copper adheres directly to the barrier material to provide a copper seed layer to which subsequently-deposited copper will adhere; and c) in an electro-chemical deposition apparatus, depositing a second layer of copper by means of electro-chemical deposition on said first layer of copper deposited in step a) until a predetermined thickness of copper is formed on each copper-receiving surface.

2. The method as in claim 1 in which step a) includes depositing said first layer of copper to a maximum thickness of 1000 Å.

3. The method as in claim 1 in which step a) includes depositing said first layer of copper to a thickness generally in the range of 50 Å to 480 Å.

4. The method as in claim 1 in which step a) includes depositing said first layer of copper to a thickness generally in the range of 100 Å to 200 Å.

5. The method as in claim 4 in which step b) includes electroplating copper onto said first adhering conforming layer.

6. The method as in claim 4 in which step b) includes electrolessly plating copper onto said first adhering conforming layer.

7. The method as in claim 1 in which step b) includes electroplating copper onto said first adhering conforming layer.

8. The method as in claim 1 in which step b) includes electrolessly plating copper onto said first adhering conforming layer.

9. A method of applying copper to selected regions of an integrated circuit, the method comprising the following steps:

depositing diffusion barrier material on selected regions of the integrated circuit to form copper-receiving surfaces;

depositing by means of chemical vapor deposition (CVD) a first adhering conforming layer of copper using (hfac)Cu(1,5-Dimethylcyclooctadiene) precursor, whereby said first layer of copper adheres to the barrier material and provides a copper seed layer to which subsequently-deposited copper will adhere; and by means of electro-chemical deposition, depositing a second layer of copper on said first layer of copper deposited until a predetermined thickness of copper is formed on each copper-receiving surface.

10. The method as in claim 9 in which said step of depositing diffusion barrier material includes depositing a diffusion barrier material selected from the group consisting of TiN, TiON, TiSiN, Ta, TaSiN, TaN, TiW, TiWN, Mo, WN, and WSiN.

11. The method as in claim 9 in which said step of depositing diffusion barrier material is performed by means of CVD.

12. The method as in claim 9 in which the step of depositing a first layer of copper includes depositing copper by CVD to a maximum thickness of 1000 Å.

13. The method as in claim 9 in which the step of depositing a first layer of copper includes depositing copper by CVD to thickness generally in the range of 50 Å to 480 Å.

14. The method as in claim 9 in which the step of depositing a first layer of copper on said diffusion barrier material includes depositing copper by CVD to a thickness generally in the range of 100 Å to 200 Å.

15. The method as in claim 14 in which said step of depositing a second layer of copper includes electroplating copper onto said first adhering conforming layer.

16. The method as in claim 14 in which said step of depositing a second layer of copper includes electrolessly plating copper onto said first adhering conforming layer.

17. The method as in claim 9 in which said step of depositing a second layer of copper includes electroplating copper onto said first adhering conforming layer.

18. The method as in claim 9 in which said step of depositing a second layer of copper includes electrolessly plating copper onto said first adhering conforming layer.

19. A method of electroplating copper onto selected copper-receiving surfaces of a substrate, the copper-receiving surfaces initially having diffusion barrier material formed thereon, the method comprising:

a) depositing a diffusion barrier material on copper receiving surfaces, b) by means of CVD, depositing a seed layer of copper on the diffusion barrier material using (hfac)Cu(1,5-Dimethylcyclooctadiene) precursor, whereby said seed layer of copper is substantially umiform in thickness on the copper-receiving surfaces and forms an adhering conforming copper layer; and c) depositing a second layer of copper on said seed layer of copper by means of electroplating until a predetermined thickness of copper is formed on each copper-receiving surface.

20. The method as in claim 19 in which step a) is carried out to deposit said seed layer of copper to a thickness of 1000 Å or less.

21. The method as in claim 19 in which step a) is carried out to deposit said seed layer of copper to a thickness generally in the range of 50 Å to 480 Å.

22. The method as in claim 19 in which step a) is carried out to deposit said seed layer of copper to a thickness generally in the range of 100 Å to 200 Å.

23. A method of electrolessly plating copper onto selected copper-receiving surfaces of a substrate the copper-receiving surfaces initially having diffusion barrier material formed thereon, the method comprising:

a) depositing a diffusion barrier material on copper receiving surfaces, b) by means of CVD, depositing a seed layer of copper on the diffusion barrier material using (hfac)Cu(1,5-Dimethylcyclooctadiene) precursor, whereby said seed layer of copper is substantially uniform in thickness on the copper-receiving surfaces and forms an adhering conforming copper layer; and c) depositing a second layer of copper on said seed layer of copper by means of electroless plating until a predetermined thickness of copper is formed on each copper-receiving surface.

24. The method as in claim 23 in which step a) is carried out to deposit said seed layer of copper to a thickness of 1000 Å or less.

25. The method as in claim 23 in which step a) is carried out to deposit said seed layer of copper to a thickness generally in the range of 50 Å to 480 Å.

26. The method as in claim 23 in which step a) is carried out to deposit said seed layer of copper to a thickness generally in the range of 100 Å to 200 Å.

* * * * *